(12) United States Patent
Iwasaki et al.

(10) Patent No.: US 6,351,114 B1
(45) Date of Patent: Feb. 26, 2002

(54) HIGH FREQUENCY CURRENT DETECTING APPARATUS

(75) Inventors: Noriyoshi Iwasaki, Chiba; Yuji Nakamichi, Kanagawa; Takashi Shirai, Tokyo; Motomu Tadama, Kanagawa, all of (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/515,864

(22) Filed: Feb. 29, 2000

(30) Foreign Application Priority Data

May 3, 1999 (JP) .......................................... 11-058350

(51) Int. Cl.⁷ ................................................. G01R 1/20
(52) U.S. Cl. .................... 324/117 R; 324/126; 324/127
(58) Field of Search ............................. 324/117 R, 127, 324/509, 445, 529, 126

(56) References Cited

U.S. PATENT DOCUMENTS 4,021,729 A * 5/1977 Hudson ...................... 324/509
4,506,214 A * 3/1985 Lienhard et al. ........ 324/117 R
5,839,185 A * 11/1998 Smith et al. .................. 29/609

* cited by examiner

Primary Examiner—Safet Metjahic
Assistant Examiner—Vincent Q. Nguyen
(74) Attorney, Agent, or Firm—Rader, Fishman & Grauer PLLC

(57) ABSTRACT

There is provided a high frequency current detecting apparatus which can measure a high frequency current with high precision without cutting a circuit conductor. The high frequency current detecting apparatus includes a core having a hollow portion, a first conductive material inserted in the hollow portion of the core and having both ends respectively protruding from both ends of the hollow portion to form probe portions, a second conductive material electrically insulated from the first conductive material and inserted in the hollow portion of the core, a resistor for generating a voltage corresponding to a high frequency current flowing through the second conductive material while the first conductive material is made a primary coil and the second conductive material is made a secondary coil, and a shield provided around the core.

3 Claims, 5 Drawing Sheets

HIGH FREQUENCY CURRENT DETECTING APPARATUS

BACKGROUND OF THE INVENTION

1. Field of the Invention

The present invention relates to a high frequency current detecting apparatus for detecting a high frequency current flowing through a conductive material.

2. Description of the Related Art

A high frequency current is employed in various apparatuses, such as communication equipment, computer, or audio video equipment. In these apparatuses, as a result of flowing of the high frequency current, there is a possibility that an unnecessary electromagnetic wave is radiated to the outside. When such electromagnetic wave is radiated, there is a case where a bad influence is exerted on another equipment. Thus, it is necessary to take a suitable countermeasure against electromagnetic wave interference.

When the countermeasure against the electromagnetic wave interference is carried out, it becomes important to measure the intensity of the high frequency current which becomes the cause of generation of the electromagnetic wave. Besides, for example, also in the case where a product in which the countermeasure has been carried out is inspected, it is necessary to measure the high frequency current.

Conventionally, measurement of the high frequency current is carried out, for example, by cutting a circuit conductor formed on a printed circuit board and directly inserting an ammeter, or by inserting a low resistor to the cut portion and measuring a voltage at both ends thereof.

However, such conventional measurement of the high frequency current has problems as described below. That is, since the printed circuit board or the like is damaged due to cutting of the circuit conductor, it becomes difficult to maintain the reliability. Besides, a certain technique is necessary for the operation of cutting the circuit conductor, and it takes a labor and time. Moreover, since the ammeter or resistor is inserted to the cut circuit conductor, the intensity of current flowing through the circuit conductor is changed, or the frequency bandwidth is changed, so that it is difficult to carry out measurement with high precision. Besides, the operation of an apparatus is influenced by insertion of the ammeter or resistor, so that there is also a case where it is difficult to measure a current value in an original operating state of the apparatus.

SUMMARY OF THE INVENTION

An object of the present invention is therefore to provide a high frequency current detecting apparatus which can measure a high frequency current with high precision without cutting a circuit conductor.

The present invention relates to a high frequency current detecting apparatus made to achieve the foregoing object. That is, the detecting apparatus comprises a core having a hollow portion, a first conductive material inserted in the hollow portion of the core and having both ends respectively protruding from both ends of the hollow portion to form probe portions, a second conductive material electrically insulated from the first conductive material and inserted in the hollow portion of the core, a resistor for generating a voltage corresponding to a high frequency current flowing through the second conductive material while the first conductive material is made a primary coil and the second conductive material is made a secondary coil, and a shield provided around the core.

In the invention as described above, the two probe portions of the first conductive material are brought into contact with different two points on a circuit conductor of an object to be measured. By this, a part of high frequency current flowing through the circuit conductor is shunted to the first conductive material, and a magnetic field is generated in the core by this shunt current. As a result, an electromotive force is excited at the second conductive material, a current flows through the resistance, and a voltage corresponding to the intensity of the current is generated at both ends of the resistor. Besides, by the shield provided around the core, it is possible to prevent an electromagnetic field irrelevant to the measurement from entering the inside of the core, so that it becomes possible to carry out the measurement with high precision.

DETAILED DESCRIPTION OF THE PREFERRED EMBODIMENTS

Figure 1:
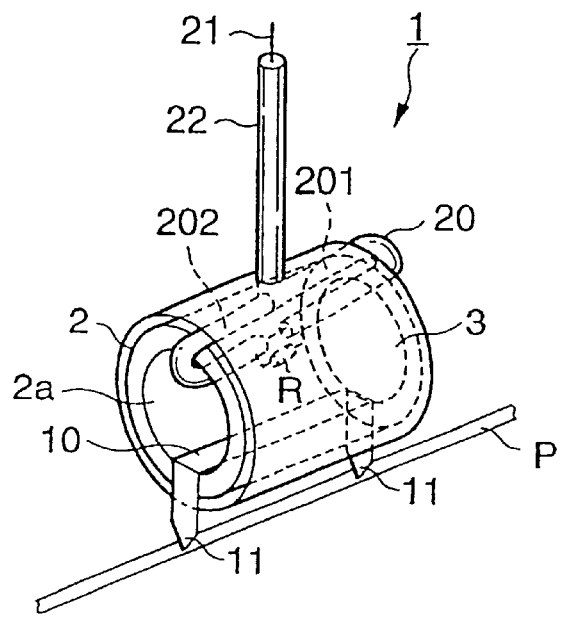
FIG. 1 is a schematic perspective view for explaining a first embodiment.
Figure 2:
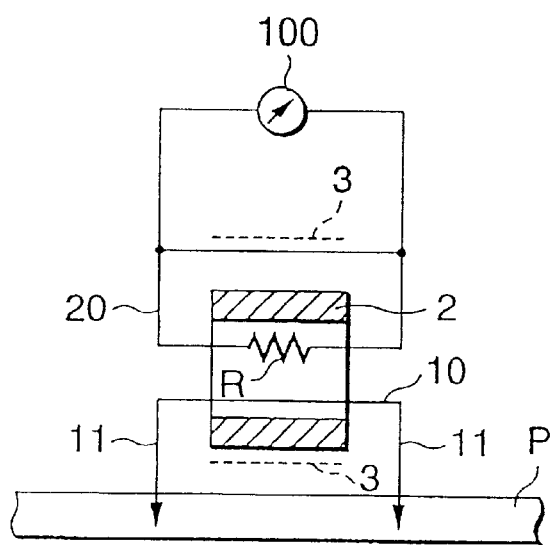
FIG. 2 is a circuit structural view for explaining the first embodiment.
Figure 3:
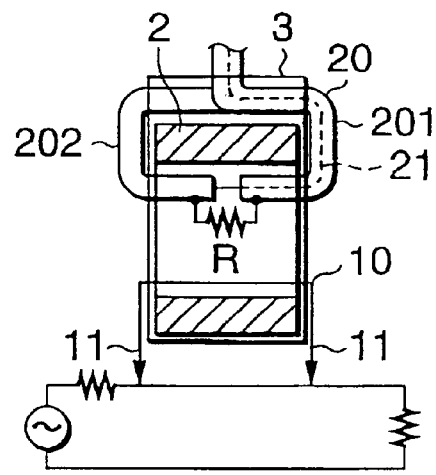
FIG. 3 is a schematic sectional view for explaining the first embodiment.
Figure 4:
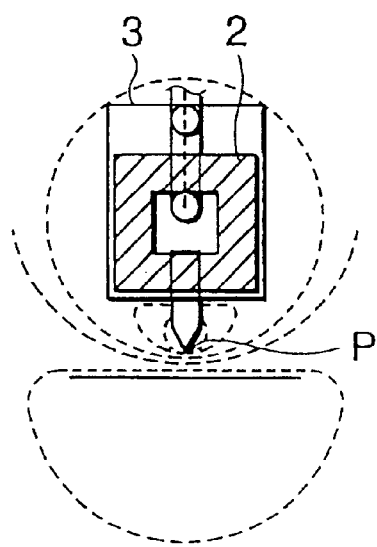
FIG. 4 is a magnetic field distribution view for explaining the first embodiment.

Hereinafter, embodiments of a high frequency current detecting apparatus of the invention will be described with reference to the drawings. FIG. 1 is a schematic perspective view for explaining a first embodiment, FIG. 2 is a circuit structural view for explaining the first embodiment, FIG. 3 is a schematic sectional view for explaining the first embodiment, and FIG. 4 is a magnetic field distribution view for explaining the first embodiment.

That is, a high frequency current detecting apparatus 1 of the first embodiment is mainly made up of a ferrite core 2 having a hollow portion 2a, a first conductive material 10 inserted in the hollow portion 2a of the core 2, a second conductive material 20 made of a coaxial line and inserted in the hollow portion 2a of the core 2, a resistor R for producing a voltage, and a ring-like shield 3 provided around the core 2.

The first conductive material 10 is formed of a band-like conductive material, and is inserted in the hollow portion 2a of the core 2, and both ends thereof respectively protrude from both ends of the hollow portion 2a to form probe portions 11. Each of the probe portions 11 is bent at substantially right angles along the end face of the core 2, so that it is easily brought into contact with a circuit conductor P which becomes an object to be measured.

The second conductive material 20 made of the coaxial line (for example, characteristic impedance 50 Ω) is electrically insulated from the first conductive material 10, and is wound to the hollow portion 2a of the core 2 so as to be opposite to the first conductive material 10. An outer conductor 22 of the second conductive material 20 is divided into a right half turn portion 201 and a left half turn portion 202 in the hollow portion 2a of the core 2. An inner conductor 21 extending from the end of the right half turn portion 201 is connected to the left half turn portion 202 in the hollow portion 2a of the core 2. The left half turn portion 202 is connected to the right half turn portion 201 at the outside of the core 2.

Moreover, the resistor R is electrically connected between the right half turn portion 201 and the left half turn portion 202 in the hollow portion 2a of the core 2. With such connection, a voltage generated at both ends of the resistor R appears between the inner conductor 21 and the outer conductor 22 of the second conductive material 20.

The shield 3 is made of a good conductor such as metal, and is provided in a ring shape along the outer periphery of the core 2. Besides, the shield 3 is electrically connected to the outer conductor 22 of the second conductive material 20 at the outside of the core 2. By the shield 3 like this, a short ring of one turn is constructed around the core 2, and it becomes possible to function as both a magnetic shield and an electrostatic shield. As shown in FIG. 4, by providing this shield 3, such a state is obtained that the core 2 is disposed in the short ring, so that it becomes possible to prevent an unnecessary magnetic field or the like generated in the vicinity or the like of the circuit conductor P from intruding into the short ring, that is, the hollow portion 2a of the core 2.

In order to detect a high frequency current flowing through the circuit conductor P by the high frequency current detecting apparatus 1 of this embodiment, the two probe portions 11 of the first conductive material 10 are brought into contact with the circuit conductor P. By this, a voltage is generated at both ends of the resistor R while the first conductive material 10 is made a primary coil and the second conductive material 20 is made a secondary coil, and this is conducted to an outside voltmeter 100 through the second conductor 20 made of the coaxial line.

That is, when both the probe portions 11 of the first conductive material 10 are brought into contact with the circuit conductor P, the high frequency current flowing through the circuit conductor P is shunted to the first conductive material 10. Then, a magnetic field is generated in the core 2 by the high frequency current flowing through the first conductive material 10, and as a result, electromotive force is excited in the second conductive material 20 and a current flows through the resistor R, and a voltage corresponding to the intensity of the current is generated at both the ends of the resistor R. This voltage is conducted through the second conductor 20 made of the coaxial line, and is measured by the voltmeter 100.

Thus, the voltage at both the ends of the resistor R is known from an indication of the voltmeter 100, and from this voltage, a current flowing through the resistor R, that is, a current flowing through the second conductive material 20 is known. The relation between the intensity of current flowing through the first conductive material 10 and the intensity of current flowing through the second conductive material 20 is experimentally obtained in advance. Then, the intensity of the current flowing through the first conductive material 10 can be obtained from the intensity of the current flowing through the second conductive material 20, and eventually, it becomes possible to detect the intensity of the high frequency current flowing through the circuit conductor P.

Like this, in the high frequency current detecting apparatus 1 of this embodiment, since it is not necessary to cut the circuit conductor P as the object to be measured, the circuit is not damaged and the reliability is not lost. Besides, the high frequency current flowing through the circuit conductor P can be detected by only bringing the probe portions 11 into contact with the circuit conductor P, so that the measurement can be made without taking a labor and time.

Moreover, since the shield 3 is provided around the core 2, an influence of an electromagnetic field from the outside does not added to a magnetic field generated in the first conductive material 10 which becomes the primary coil, and it becomes possible to measure the high frequency current flowing through the circuit conductor P with high precision.

Figure 5:
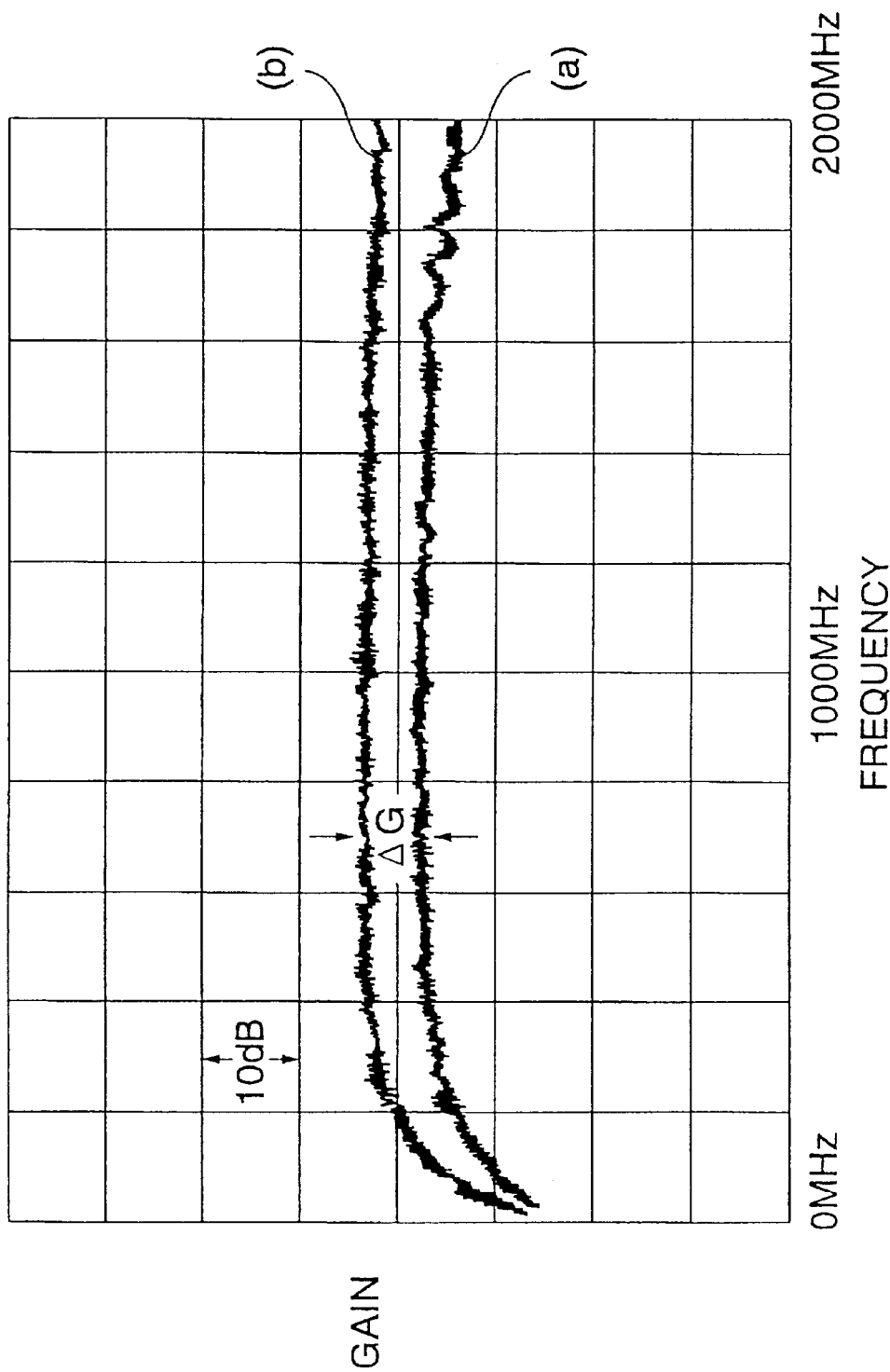
FIG. 5 is a view for explaining the characteristics of the first embodiment.

FIG. 5 is a view for explaining the characteristics of the first embodiment, and in the drawing, (a) designates a case (this embodiment) where the short ring of the shield is constructed around the core, and (b) designates a case where the short ring is not constructed. Incidentally, in this drawing, the horizontal axis indicates frequency (MHz) and the vertical axis indicates gain (dB).

As shown by (a) of FIG. 5, by constructing the short ring around the core, as compared with the case shown by (b) of FIG. 5 where the short ring is not constructed, the gain is lowered by ΔG. That is, by constructing the short ring, it is possible to remove the influence due to unnecessary electromagnetic field corresponding to ΔG, and it becomes possible to improve the measurement precision.

Incidentally, by attaching a noise filter such as a ferrite clamp to the second conductive material 20 for conducting a detected signal to the voltmeter 100, a common mode current on the second conductive material 20 can be blocked, and the measurement precision can be further raised.

Figure 6:
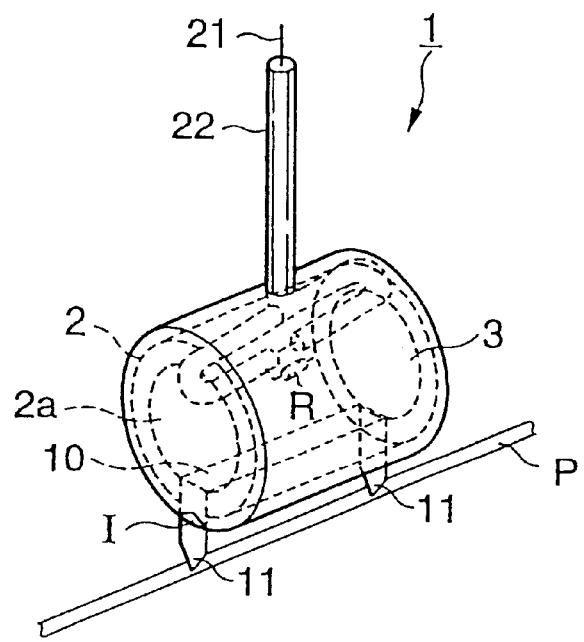
FIG. 6 is a schematic perspective view for explaining a second embodiment.
Figure 7:
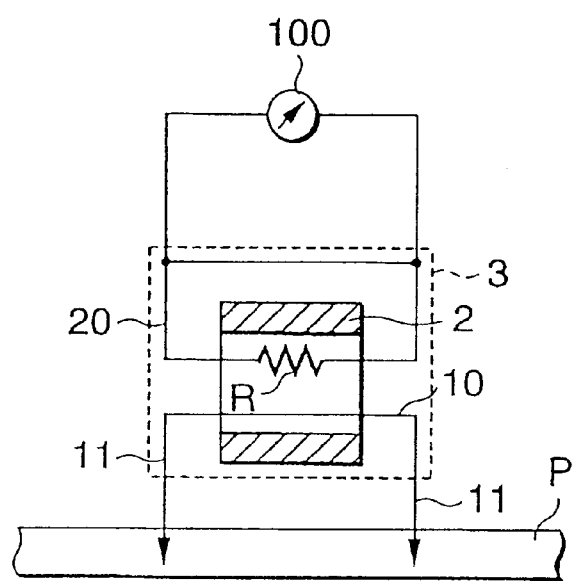
FIG. 7 is a circuit structural view for explaining the second embodiment.
Figure 8:
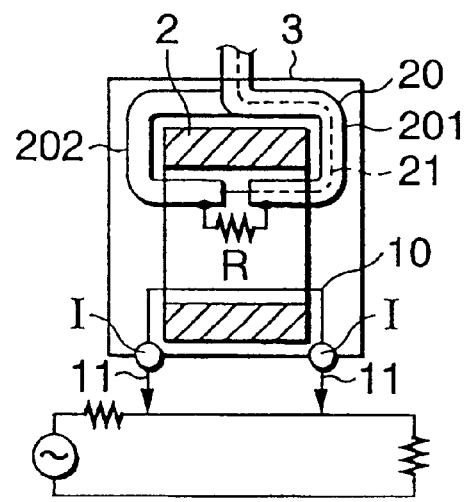
FIG. 8 is a schematic sectional view for explaining the second embodiment.
Figure 9:
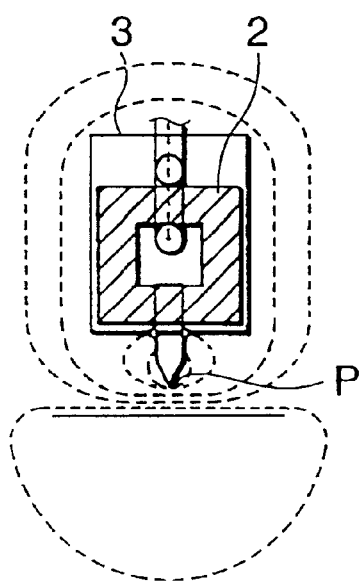
FIG. 9 is a magnetic field distribution view for explaining the second embodiment.

Next, a second embodiment of the invention will be described. FIG. 6 is a schematic perspective view for explaining a second embodiment, FIG. 7 is a circuit structural view for explaining the second embodiment, FIG. 8 is a schematic sectional view for explaining the second embodiment, and FIG. 9 is a magnetic field distribution view for explaining the second embodiment.

That is, although a high frequency current detecting apparatus 1 of the second embodiment is similar to the first embodiment in that the apparatus includes a core 2 having a hollow portion 2a, a first conductive material 10 inserted in the hollow portion 2a of the core 2, a second conductive material 20 made of a coaxial line and inserted in the hollow portion 2a of the core 2, and a resistor R for producing a voltage, the apparatus is different in that a shield 3 covers the whole of the core 2.

That is, the shield 3 is made of a good conductor such as metal, and is provided in such a state that it covers the whole of the periphery of the core 2. Besides, the shield 3 is electrically connected to an outer conductor 22 of the second conductive material 20 at the outside of the core 2. Incidentally, when the whole of the periphery of the core 2 is covered with the shield 3, in order that each of probe portions 11 of the first conductive material 10 is not electrically connected to the shield 3 at a portion where it protrudes from the core 2, a hole is provided in this portion of the shield 3, and insulation is kept by an insulative sealing agent I made of an adhesive or the like.

The shield 3 like this comes to be able to function as both a magnetic shield and an electrostatic shield. As shown in FIG. 9, by providing this shield 3, it becomes possible to prevent an unnecessary magnetic field or the like generated in the vicinity or the like of the circuit conductor P from intruding into the hollow portion 2a of the core 2.

In order to detect the high frequency current flowing through the circuit conductor P by the high frequency current detecting apparatus 1 of the second embodiment, similarly to the first embodiment, the probe portions 11 of the first conductive material 10 are brought into contact with the circuit conductor P. By this, a voltage is generated at both ends of the resistor R while the first conductive material 10 is made a primary coil and the second conductive material 20 is made a secondary coil, and this is conducted to an outside voltmeter 100 through the second conductive material 20 made of the coaxial line.

A voltage at both the ends of the resistor R is known from an indication of this voltmeter 100, and from this voltage, a current flowing through the resistor R, that is, a current flowing through the second conductive material 20 is known. The relation between the intensity of the current flowing through the first conductive material 10 and the intensity of the current flowing through the second conductive material 20 is experimentally obtained in advance. Then, the intensity of the current flowing through the first conductive material 10 can be obtained form the intensity of the current flowing through the second conductive material 20, and eventually, it becomes possible to detect the intensity of the high frequency current flowing through the circuit conductor P.

Like this, also in the high frequency current detecting apparatus 1 of the second embodiment, similarly to the first embodiment, since it is not necessary to cut the circuit conductor P as the object to be measured, the circuit is not damaged and the reliability is not lost. Besides, since the high frequency current flowing through the circuit conductor P can be detected by only bringing the probe portions 11 into contact with the circuit conductor P, the measurement can be made without taking a labor and time.

Moreover, since the shield 3 is provided to cover the whole periphery of the core 2, an influence of an electromagnetic field from the outside is not added to a magnetic field generated in the first conductive material 10 which becomes the primary coil, and it becomes possible to measure the high frequency current flowing through the circuit conductor P with high precision.

Incidentally, by attaching a noise filter such as a ferrite clamp to the second conductive material 20 for conducting a detected signal to the voltmeter 100, a common mode current on the second conductive material 20 can be blocked, and the measurement precision can be further raised.

As described above, according to the high frequency current detecting apparatus of the invention, the following effects can be obtained. That is, when a high frequency current flowing through a conductive material is detected, since it is not necessary to cut the conductive material, a printed circuit board or the like is not damaged, and the reliability is not lost. Besides, it is not necessary to cut the circuit conductor, but merely probe portions are brought into contact with the conductor, so that it does not take a labor or time, and it becomes possible to make the measurement very easily. Moreover, it becomes possible to make the measurement with high precision without receiving an influence of electromagnetic field from an adjacent pattern or the vicinity.

What is claimed is:

1. A high frequency current detecting apparatus for detecting a high frequency current flowing through a conductor, comprising:

a core having a hollow portion;

a first conductive material inserted in the hollow portion of the core and having both ends respectively protruding from both ends of the hollow portion to form probe portions;

a second conductive material electrically insulated from the first conductive material and inserted in the hollow portion of the core;

a resistor connected to the second conductive material, wherein the first conductive material is made a primary coil and the second conductive material is made a secondary coil when the probe portions contact the conductor and wherein a voltage corresponding to a high frequency current flowing through the conductor appears across the resistor when the probe portions contact the conductor; and a shield provided around the core.

2. A high frequency current detecting apparatus according to claim 1, wherein the shield is provided in a ring shape around the core.

3. A high frequency current detecting apparatus according to claim 1, wherein the shield is provided in a state where it covers the whole of a periphery of the core.

* * * * *